(12) United States Patent
Okita et al.

(10) Patent No.: US 12,091,772 B2
(45) Date of Patent: Sep. 17, 2024

(54) SILICON CARBIDE SUBSTRATE

(71) Applicant: Sumitomo Electric Industries, Ltd., Osaka (JP)

(72) Inventors: Kyoko Okita, Osaka (JP); Tsubasa Honke, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 974 days.

(21) Appl. No.: 16/971,814

(22) PCT Filed: Oct. 29, 2018

(86) PCT No.: PCT/JP2018/040073
§ 371 (c)(1),
(2) Date: Aug. 21, 2020

(87) PCT Pub. No.: WO2019/167337
PCT Pub. Date: Sep. 6, 2019

(65) Prior Publication Data
US 2020/0385887 A1    Dec. 10, 2020

(30) Foreign Application Priority Data

Mar. 1, 2018  (JP) ................................. 2018-036553

(51) Int. Cl.
*C30B 29/36* (2006.01)
*C30B 23/02* (2006.01)
(Continued)

(52) U.S. Cl.
CPC ............ *C30B 29/36* (2013.01); *C30B 23/025* (2013.01); *H01L 21/02378* (2013.01); *H01L 21/30625* (2013.01); *H01L 29/1608* (2013.01)

(58) Field of Classification Search
None
See application file for complete search history.

(56) References Cited

U.S. PATENT DOCUMENTS

2003/0080384 A1* 5/2003 Takahashi ......... H01L 21/02584
257/E21.054
2017/0236905 A1   8/2017 Torimi et al.
(Continued)

FOREIGN PATENT DOCUMENTS

JP        2016-164120 A    9/2016
JP        2017-105697 A    6/2017
(Continued)

*Primary Examiner* — Evren Seven
(74) *Attorney, Agent, or Firm* — Faegre Drinker Biddle & Reath LLP

(57) ABSTRACT

A silicon carbide substrate according to the present disclosure is a silicon carbide substrate that includes a first main surface and a second main surface opposite to the first main surface, and is made of silicon carbide having a polytype of 4H. The first main surface has a maximum diameter of more than or equal to 140 mm. The first main surface is a {0001} plane or a plane inclined at an off angle of more than 0° and less than or equal to 8° relative to the {0001} plane. Half-widths of a peak corresponding to a folded mode of a longitudinal optical branch of a Raman spectrum of the silicon carbide substrate within a plane of the first main surface have an average value of less than 2.5 cm$^{-1}$, and a standard deviation of less than or equal to 0.06 cm$^{-1}$.

2 Claims, 9 Drawing Sheets

(51) Int. Cl.
*H01L 21/02* (2006.01)
*H01L 21/306* (2006.01)
*H01L 29/16* (2006.01)

(56) References Cited

U.S. PATENT DOCUMENTS

2018/0069084 A1* 3/2018 Torimi .................. H01L 21/304
2018/0254323 A1 9/2018 Ueta et al.
2020/0385887 A1 12/2020 Okita et al.

FOREIGN PATENT DOCUMENTS

WO WO-2017/064897 A1 4/2017
WO WO-2019/167337 A1 9/2019

* cited by examiner

SILICON CARBIDE SUBSTRATE

TECHNICAL FIELD

The present disclosure relates to a silicon carbide substrate. The present application claims priority to Japanese Patent Application No. 2018-036553 filed on Mar. 1, 2018, the entire contents of which are incorporated herein by reference.

BACKGROUND ART

Japanese Patent Laying-Open No. 2016-164120 (PTL 1) describes a silicon carbide single crystal wafer having a Raman index of more than or equal to 0.03 and less than or equal to 0.2.

CITATION LIST

Patent Literature

PTL 1: Japanese Patent Laying-Open No. 2016-164120

SUMMARY OF INVENTION

A silicon carbide substrate according to the present disclosure is a silicon carbide substrate that includes a first main surface and a second main surface opposite to the first main surface, and is made of silicon carbide having a polytype of 4H. The first main surface has a maximum diameter of more than or equal to 140 mm. The first main surface is a {0001} plane or a plane inclined at an off angle of more than 0° and less than or equal to 8° relative to the {0001} plane. Half-widths of a peak corresponding to a folded mode of a longitudinal optical branch of a Raman spectrum of the silicon carbide substrate within a plane of the first main surface have an average value of less than 2.5 $cm^{-1}$, and a standard deviation of less than or equal to 0.06 $cm^{-1}$.

DETAILED DESCRIPTION

Figure 1:
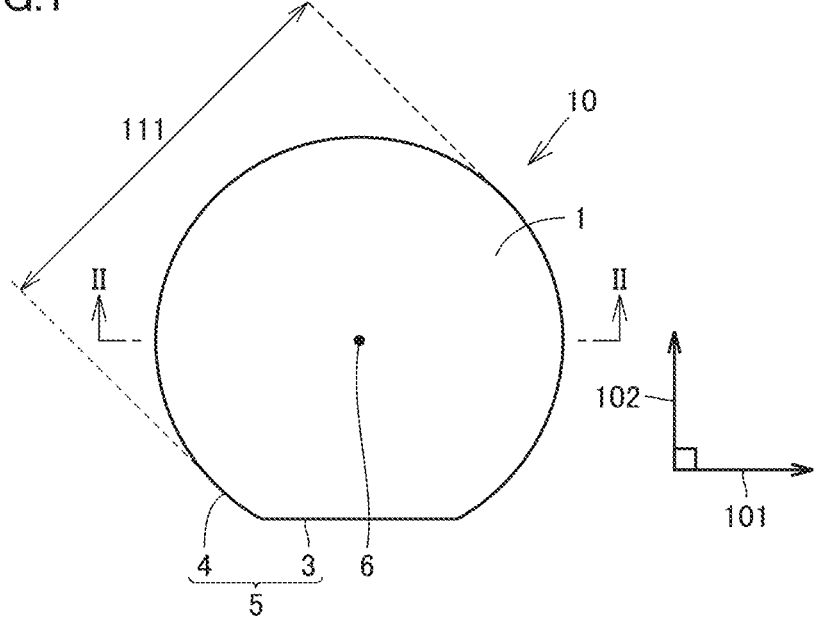
FIG. 1 is a schematic plan view showing a structure of a silicon carbide substrate according to the present embodiment.

[Problem to be Solved by the Present Disclosure]

An object of the present disclosure is to provide a silicon carbide substrate capable of improving the quality of a silicon carbide epitaxial layer.

[Advantageous Effect of the Present Disclosure]

According to the present disclosure, a silicon carbide substrate capable of improving the quality of a silicon carbide epitaxial layer can be provided.

[Description of Embodiment of the Present Disclosure]

(1) A silicon carbide substrate according to the present disclosure is a silicon carbide substrate that includes a first main surface and a second main surface opposite to the first main surface, and is made of silicon carbide having a polytype of 4H. The first main surface has a maximum diameter of more than or equal to 140 mm. The first main surface is a {0001} plane or a plane inclined at an off angle of more than 0° and less than or equal to 8° relative to the {0001} plane. Half-widths of a peak corresponding to a folded mode of a longitudinal optical branch of a Raman spectrum of the silicon carbide substrate within a plane of the first main surface have an average value of less than 2.5 $cm^{-1}$, and a standard deviation of less than or equal to 0.06 $cm^{-1}$.

(2) In the silicon carbide substrate according to (1) described above, the silicon carbide substrate may have a thickness of more than or equal to 300 μm and less than or equal to 600 μm.

[Details of Embodiment of the Present Disclosure]

Hereinafter, an embodiment of the present disclosure will be described based on the drawings. It should be noted that, in the drawings below, identical or corresponding parts will be designated by the same reference numerals, and the description thereof will not be repeated. Regarding crystallographic indications in the present specification, an individual orientation is represented by [ ], a group orientation is represented by < >, an individual plane is represented by ( ), and a group plane is represented by { }. Generally, a negative index is supposed to be crystallographically indicated by putting "-" (bar) above a numeral, but is indicated by putting the negative sign before the numeral in the present specification.

First, a configuration of a silicon carbide substrate 10 according to the present embodiment will be described.

Figure 2:
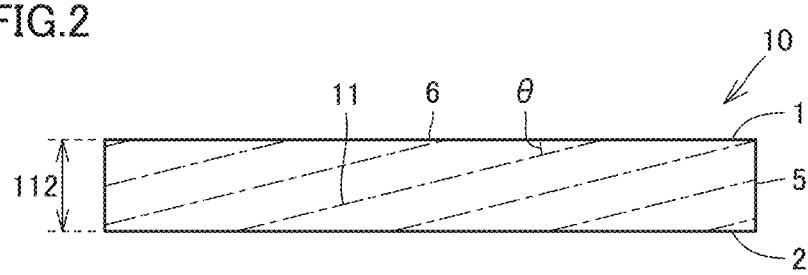
FIG. 2 is a schematic cross sectional view taken along a line II-II in FIG. 1 and viewed in the direction of arrows.

As shown in FIGS. 1 and 2, silicon carbide substrate 10 according to the present embodiment mainly has a first main surface 1, a second main surface 2, and an outer circumferential surface 5. Second main surface 2 is opposite to first main surface 1. Silicon carbide substrate 10 is made of silicon carbide having a polytype of 4H. Silicon carbide substrate 10 contains an n type impurity such as nitrogen (N), for example. Silicon carbide substrate 10 has an n type conductivity type, for example. The concentration of the n type impurity in silicon carbide substrate 10 is more than or equal to $1\times10^{17}$ cm$^{-3}$ and less than or equal to $1\times10^{20}$ cm$^{-3}$, for example.

As shown in FIG. 1, first main surface 1 has a maximum diameter 111 of more than or equal to 140 mm. Maximum diameter 111 of first main surface 1 may be, although not particularly limited to, less than or equal to 160 mm, less than or equal to 200 mm, less than or equal to 250 mm, or less than or equal to 300 mm, for example. Maximum diameter 111 is the length of a line segment having a maximum length, of line segments each connecting two arbitrary positions on an outer edge of first main surface 1, when first main surface 1 is viewed from a direction perpendicular to first main surface 1. As shown in FIG. 2, silicon carbide substrate 10 has a thickness 112 of more than or equal to 300 μm and less than or equal to 600 μm, for example. Thickness 112 of silicon carbide substrate 10 may be, although not particularly limited to, more than or equal to 350 μm, or more than or equal to 400 μm, for example. Thickness 112 of silicon carbide substrate 10 may be, although not particularly limited to, less than or equal to 550 μm, or less than or equal to 500 μm, for example.

First main surface 1 is a {0001} plane or a plane inclined at an off angle θ (see FIG. 2) of more than 0° and less than or equal to 8° relative to the {0001} plane. Off angle θ may be more than or equal to 1°, or more than or equal to 2°, for example. Off angle θ may be less than or equal to 7°, or less than or equal to 6°. Specifically, first main surface 1 may be a (0001) plane or a plane inclined at off angle θ of more than 0° and less than or equal to 8° relative to the (0001) plane. First main surface 1 may be a (000-1) plane or a plane inclined at off angle θ of more than 0° and less than or equal to 8° relative to the (000-1) plane. The direction of inclination of first main surface 1 is a <11-20> direction, for example. In FIG. 2, a plane 11 indicated by an alternate long and short dash line is the {0001} plane.

As shown in FIG. 1, outer circumferential surface 5 may have a first flat 3 and an arc-shaped portion 4, for example. A center 6 of first main surface 1 is the center of a circle including an arc that follows arc-shaped portion 4. First flat 3 exists to linearly extend along a first direction 101, for example. Arc-shaped portion 4 is continuous to first flat 3. Outer circumferential surface 5 may have a second flat (not shown) existing to linearly extend along a second direction 102, for example. Second direction 102 is a <1-100> direction, for example. First direction 101 is a direction parallel to first main surface 1 and perpendicular to second direction 102. First direction 101 is the <11-20> direction, for example.

First main surface 1 is an epitaxial layer formation surface, for example. Stated from another perspective, a silicon carbide epitaxial layer 20 (see FIG. 13) is provided on first main surface 1. Second main surface 2 is a drain electrode formation surface, for example. Stated from another perspective, a drain electrode (not shown) of a metal oxide semiconductor field effect transistor (MOSFET) is formed on second main surface 2.

Next, a configuration of a Raman spectroscopic apparatus for measuring a Raman spectrum of silicon carbide substrate 10 will be described.

Figure 3:
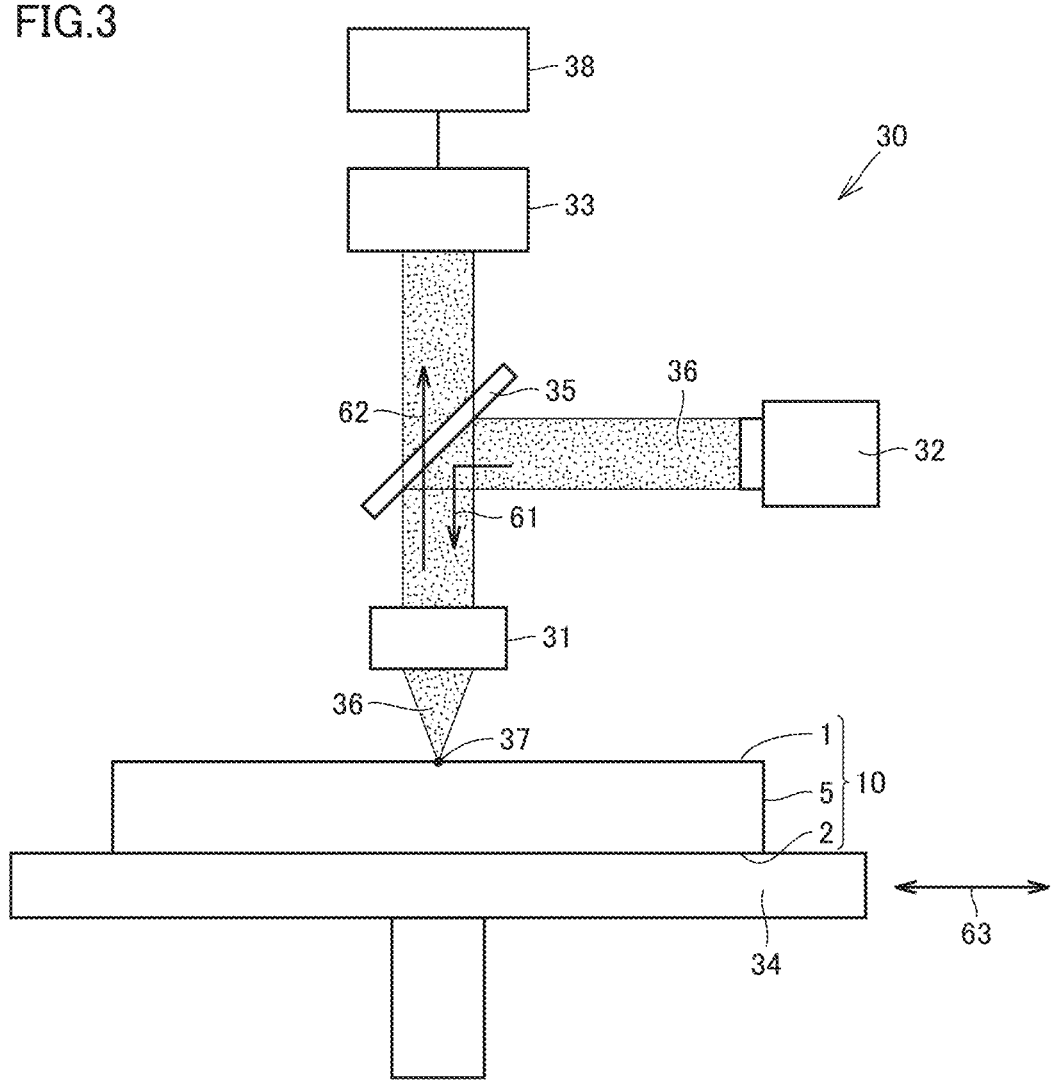
FIG. 3 is a schematic view showing a configuration of an apparatus for measuring a Raman spectrum.

As shown in FIG. 3, a Raman spectroscopic apparatus 30 mainly has a light source 32, an objective lens 31, a spectroscope 33, a stage 34, a beam splitter 35, and a detector 38, for example. As Raman spectroscopic apparatus 30, LabRAM HR-800 provided by HORIBA JOBIN YVON can be used, for example. Light source 32 is an yttrium aluminum garnet (YAG) laser, for example. Light source 32 has an excitation wavelength of 532 nm, for example. Intensity of laser irradiation is 0.1 mW, for example. Backscattering measurement is used, for example, as a measurement method. Objective lens 31 has a magnification of 50×. A measurement area has a diameter of 1 μm, for example. An integration time is 5 seconds, for example. The number of times of integration is 10, for example. A grating is 2400 gr/mm.

Next, a method for measuring the Raman spectrum of silicon carbide substrate 10 will be described.

First, incident light 36 is emitted from the YAG laser serving as light source 32. As indicated by an arrow 61 in FIG. 3, incident light 36 is reflected by beam splitter 35 and is emitted toward first main surface 1 of silicon carbide substrate 10. Raman spectroscopic apparatus 30 employs a confocal optical system, for example. In the confocal optical system, a confocal aperture (not shown) having a circular opening is disposed at a position conjugate to a focal point of objective lens 31. This allows detection of only light at a focused position (height).

As indicated by an arrow 62 in FIG. 3, Raman scattered light scattered by silicon carbide substrate 10 passes through beam splitter 35 and is introduced into spectroscope 33. In spectroscope 33, the Raman scattered light is resolved for each wave number. The Raman scattered light resolved for each wave number is detected by detector 38. Thereby, a Raman spectrum with the wave number on the horizontal axis and intensity of the Raman scattered light on the vertical axis is obtained. Stage 34 is movable in the direction parallel to first main surface 1 of silicon carbide substrate 10 (direction indicated by an arrow 63).

Figure 4:
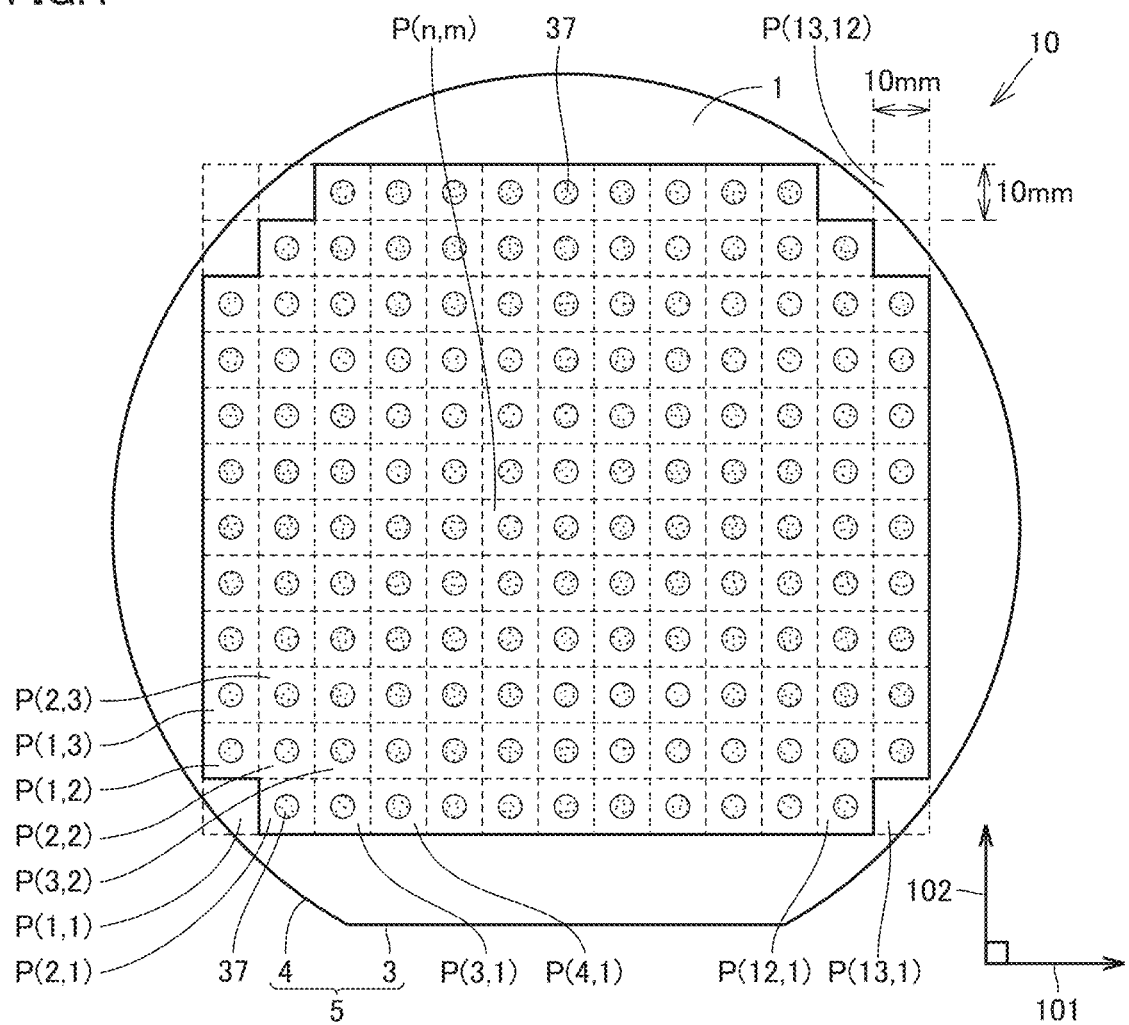
FIG. 4 is a schematic plan view showing a method for measuring the Raman spectrum.

As shown in FIG. 4, first main surface 1 is segmented into a plurality of square areas each measuring 10 mm per side, for example. Specifically, a virtual rectangle is overlapped on the first main surface. The rectangle has a length of 130 mm, for example, in a longitudinal direction. The rectangle has a length of 120 mm, for example, in a short direction. The longitudinal direction of the rectangle is parallel to first direction 101, for example. The short direction of the rectangle is parallel to second direction 102, for example.

As shown in FIG. 4, the rectangle is disposed such that four corners thereof are beyond outer circumferential surface 5 when viewed from the direction perpendicular to the first main surface. The rectangle having a size of 130 mm by 120 mm is segmented into 156 (13×12) square areas each measuring 10 mm per side. Among the 156 square areas, one square area at the lower right of FIG. 4, one square area at the lower left of FIG. 4, three square areas at the upper right of FIG. 4, and three square areas at the upper left of FIG. 4 have portions that do not overlap with the first main surface. These eight square areas having portions that do not overlap with the first main surface are subtracted from the 156 square areas, and resultant 148 square areas are areas that entirely overlap with the first main surface. The first main surface is segmented into the above 148 square areas each measuring 10 mm per side, for example.

The position of the square area located at the lower left of FIG. 4 is assumed as a position P(1, 1), for example. The position adjacent to position P(1, 1) on the right side thereof (adjacent in first direction 101) is a position P(2, 1). The position adjacent to position P(2, 1) on the right side thereof is a position P(3, 1), and the position adjacent to position P(3, 1) on the right side thereof is a position P(4, 1). The position of the square area located at the lower right of FIG. 4 is a position P(13, 1). The position adjacent to position P(1, 1) on the upper side thereof (adjacent in second direction 102) is a position P(1, 2). The position adjacent to position P(1, 2) on the right side thereof (adjacent in first direction 101) is a position P(2, 2), and the position adjacent to position P(2, 2) on the right side thereof is a position P(3, 2). The position adjacent to position P(1, 2) on the upper side thereof (adjacent in second direction 102) is a position P(1, 3). The position adjacent to position P(1, 3) on the right side thereof (adjacent in first direction 101) is a position P(2, 3). Thus, using position P(1, 1) as a reference, a square area that is an n-th one on the right side (first direction 101 side) thereof and is an m-th one on the upper side (second direction 102 side) thereof is located at a position P(n, m).

As shown in FIG. 4, incident light 36 is first focused on a square area at position P(2, 1), for example, to measure a Raman spectrum in a measurement area 37 in the square area at position P(2, 1). Incident light 36 is focused on the center of the square area at position P(2, 1). Measurement area 37 for Raman scattered light is an area having a diameter of about 1 μm and including the center of the square area. Then, stage 34 is moved in the direction parallel to the first main surface (for example, toward the left side in FIG. 4), and the focal point of incident light 36 moves to a square area at position P(3, 1). Thereby, a Raman spectrum in the square area at position P(3, 1) is measured. By repeating the above process, a Raman spectrum in each square area from the square area at position P(2, 1) to a square area at a position P(12, 1) is measured.

Then, stage 34 is moved in the direction parallel to the first main surface (for example, toward the upper side in FIG. 4), and the focal point of incident light 36 moves to a square area at position P(1, 2). Thereby, a Raman spectrum in the square area at position P(1, 2) is measured. By moving the focal point of incident light 36 in the direction parallel to first direction 101 and in the direction parallel to second direction 102 as described above, a Raman spectrum in each of the 148 square areas is measured. It should be noted that the Raman spectra only have to be measured in all of the 148 square areas described above, and the order of measuring the Raman spectra is not particularly limited.

Figure 5:
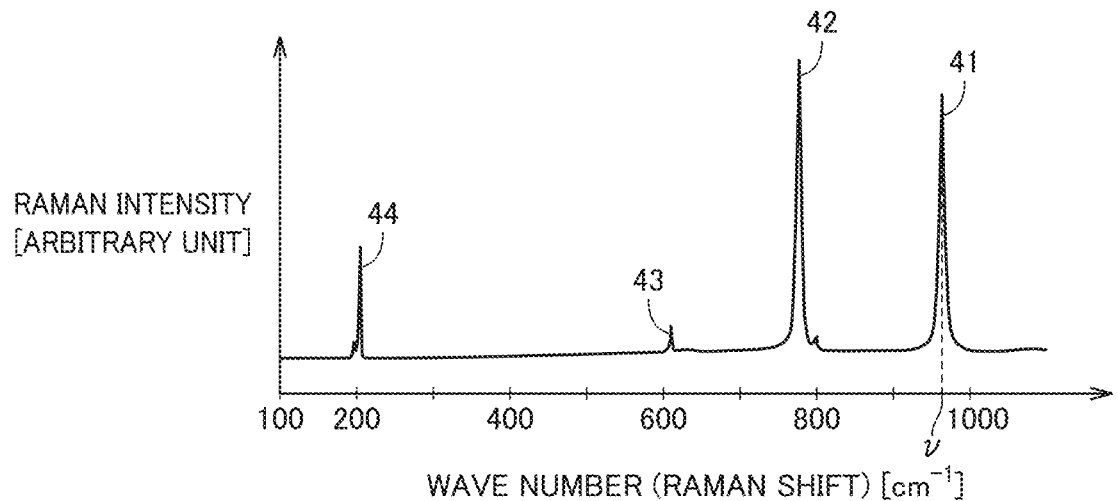
FIG. 5 is a view showing an example of the Raman spectrum.

FIG. 5 shows an example of the Raman spectrum of silicon carbide substrate 10. The horizontal axis in FIG. 5 represents a wave number (Raman shift). The vertical axis in FIG. 5 represents intensity of Raman scattered light (Raman intensity). Excitation light of light source 32 has a wavelength of 514.5 nm. The Raman shift is the difference between a wave number of excitation light and a wave number of Raman scattered light in an object to be measured. When the object to be measured is silicon carbide having a polytype of 4H, mainly four peaks are observed in its Raman spectrum. A first peak 41 is Raman scattered light resulting from a folded mode of a longitudinal optical (LO) branch. First peak 41 appears around 964 cm$^{-1}$, for example. A second peak 42 is Raman scattered light resulting from a folded mode of a transverse optical (TO) branch. Second peak 42 appears around 776 cm$^{-1}$, for example. A third peak 43 is Raman scattered light resulting from a folded mode of a longitudinal acoustic (LA) branch. Third peak 43 appears around 610 cm$^{-1}$, for example. A fourth peak 44 is Raman scattered light resulting from a folded mode of a transverse acoustic (TA) branch. Fourth peak 44 appears around 196 cm$^{-1}$, for example.

Figure 6:
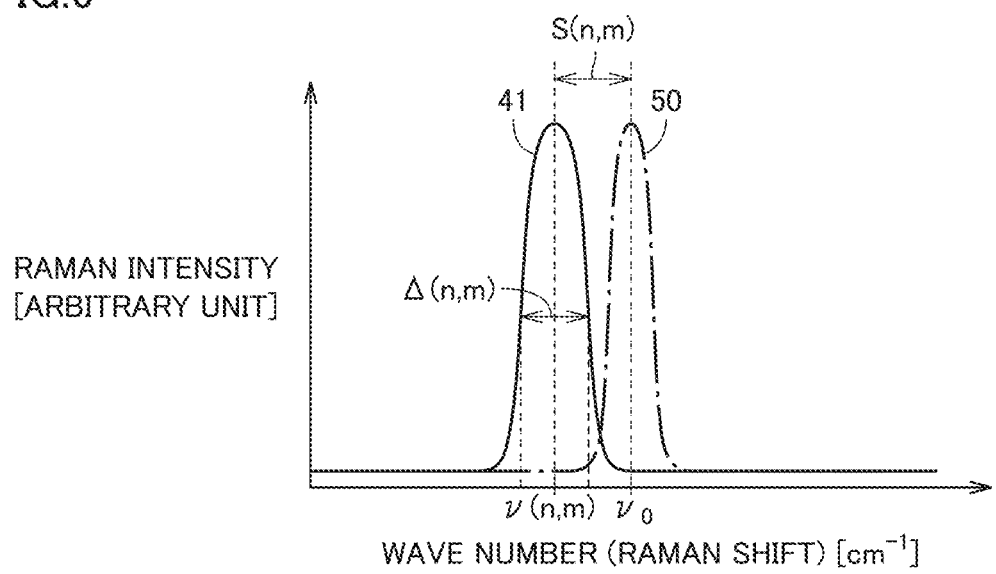
FIG. 6 is a view showing an example of a Raman spectrum measured in a square area at a position P(n, m).

A Raman profile indicated by a solid line in FIG. 6 represents a Raman spectrum measured in the square area at position P(n, m) (see FIG. 4). Using this Raman spectrum, a wave number ν(n, m) of peak 41 corresponding to the folded mode of the longitudinal optical branch is determined. Likewise, a half-width Δ(n, m) of peak 41 is determined. It should be noted that peak 41 corresponding to the folded mode of the longitudinal optical branch is a peak of a Raman profile generated resulting from the folded mode of the longitudinal optical branch. A Raman profile 50 indicated by an alternate long and short dash line in FIG. 6 represents a peak corresponding to a folded mode of a longitudinal optical branch of a Raman spectrum of silicon carbide having a polytype of 4H and having zero stress. A wave number $ν_0$ of this peak can be determined as follows, for example. A peak of a Raman spectrum determined by Raman measurement of a Lely crystal (crystal grown with a Lely method) is set as wave number $ν_0$ with zero stress. The Lely crystal is grown by natural nucleation and includes only a small amount of impurity, and can thus be regarded as having zero stress.

Tensile stress or compressive stress occurs in the vicinity of first main surface 1 of silicon carbide substrate 10 after slicing. Thus, the wave number indicating the peak resulting from the folded mode of the longitudinal optical branch of the Raman profile measured in the square area at position P(n, m) shifts from wave number $ν_0$ indicating the peak corresponding to the folded mode of the longitudinal optical branch of the Raman spectrum of silicon carbide having a polytype of 4H and having zero stress. When tensile stress occurs in the measurement area, the wave number indicating the peak corresponding to the folded mode of the longitudinal optical branch of the Raman profile in the measurement area shifts negatively. Conversely, when compressive stress occurs in the measurement area, the wave number indicating the peak corresponding to the folded mode of the longitudinal optical branch of the Raman profile in the measurement area shifts positively. By determining a shift amount S(n, m) of the peak in this manner, the stress in the measurement area can be quantitatively evaluated.

Figure 7:
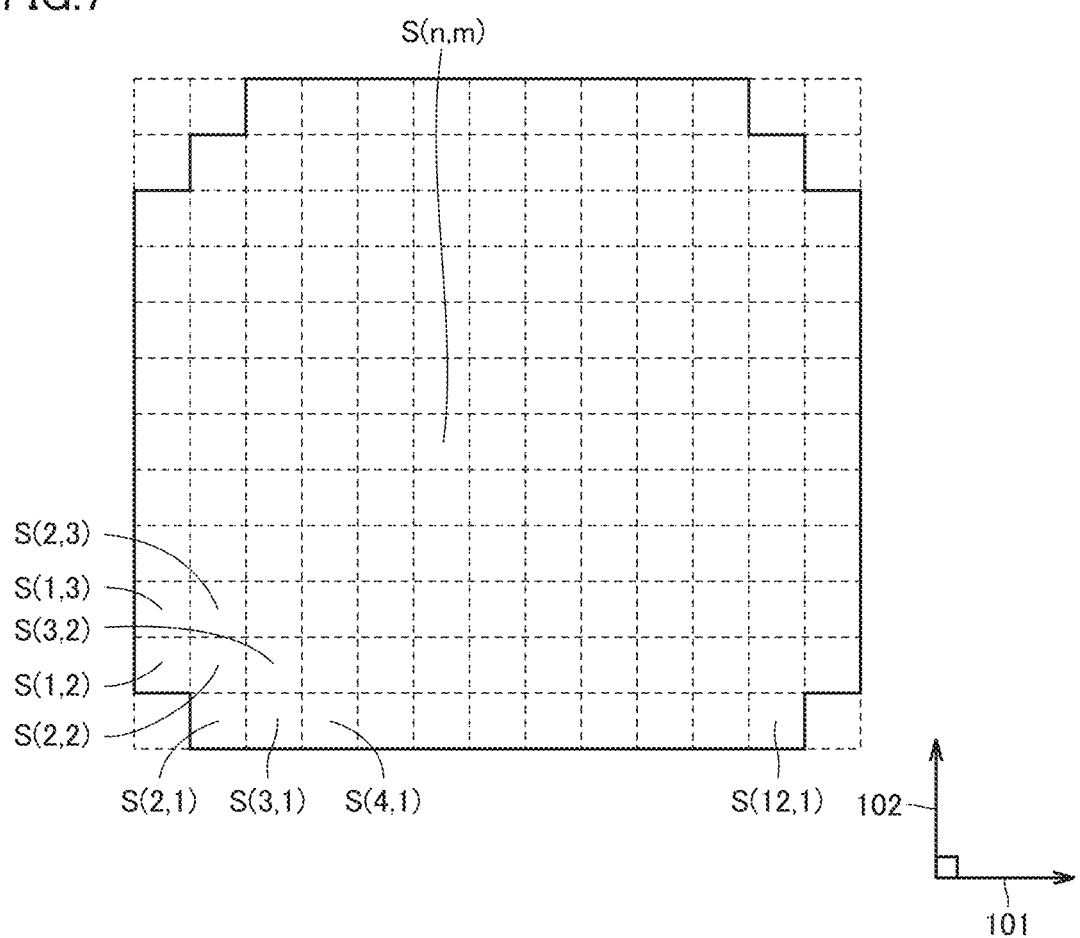
FIG. 7 is a view showing the relation between shift amounts of a peak corresponding to a folded mode of a longitudinal optical branch and measurement positions.

Shift amount S(n, m) described above is the absolute value of a value obtained by subtracting the wave number indicating the peak corresponding to the folded mode of the longitudinal optical branch of the Raman spectrum of silicon carbide having a polytype of 4H and having zero stress, from the wave number indicating the peak corresponding to the folded mode of the longitudinal optical branch of the Raman spectrum of the silicon carbide substrate. FIG. 7 shows distribution of shift amounts of the peak within the first main surface (in-plane distribution). As shown in FIG. 7, shift amounts S(n, m) of the peak are determined in 148 square areas within a region surrounded by a solid line.

Here, n is an integer from 1 to 13, and m is an integer from 1 to 12. However, shift amounts S(n, m) of the peak at positions where (n, m) is (1, 1), (13, 1), (1, 11), (1, 12), (2, 12), (12, 12), (13, 11), and (13, 12) are excluded. The average value and the standard deviation of the shift amounts of the peak in the plurality of (148) square areas are the average value and the standard deviation of the shift amounts of the peak within first main surface 1.

Then, a half-width of the peak corresponding to the folded mode of the longitudinal optical branch of silicon carbide is determined. Specifically, half-width Δ(n, m) of the peak corresponding to the folded mode of the longitudinal optical branch of the Raman spectrum in each of the plurality of (148) square areas is determined. Half-width Δ(n, m) is specifically a full width at half maximum (FWHM). It should be noted that the half-width of the peak is an indicator of stress distribution within a square area. Stress distribution within a measurement range decreases as the half-width of the peak decreases. Conversely, stress distribution within the measurement range increases as the half-width of the peak increases. By determining the half-width of the peak corresponding to the folded mode of the longitutudinal optical branch of the Raman spectrum in this manner, variations in the stress within the measurement area can be quantitatively evaluated.

Figure 8:
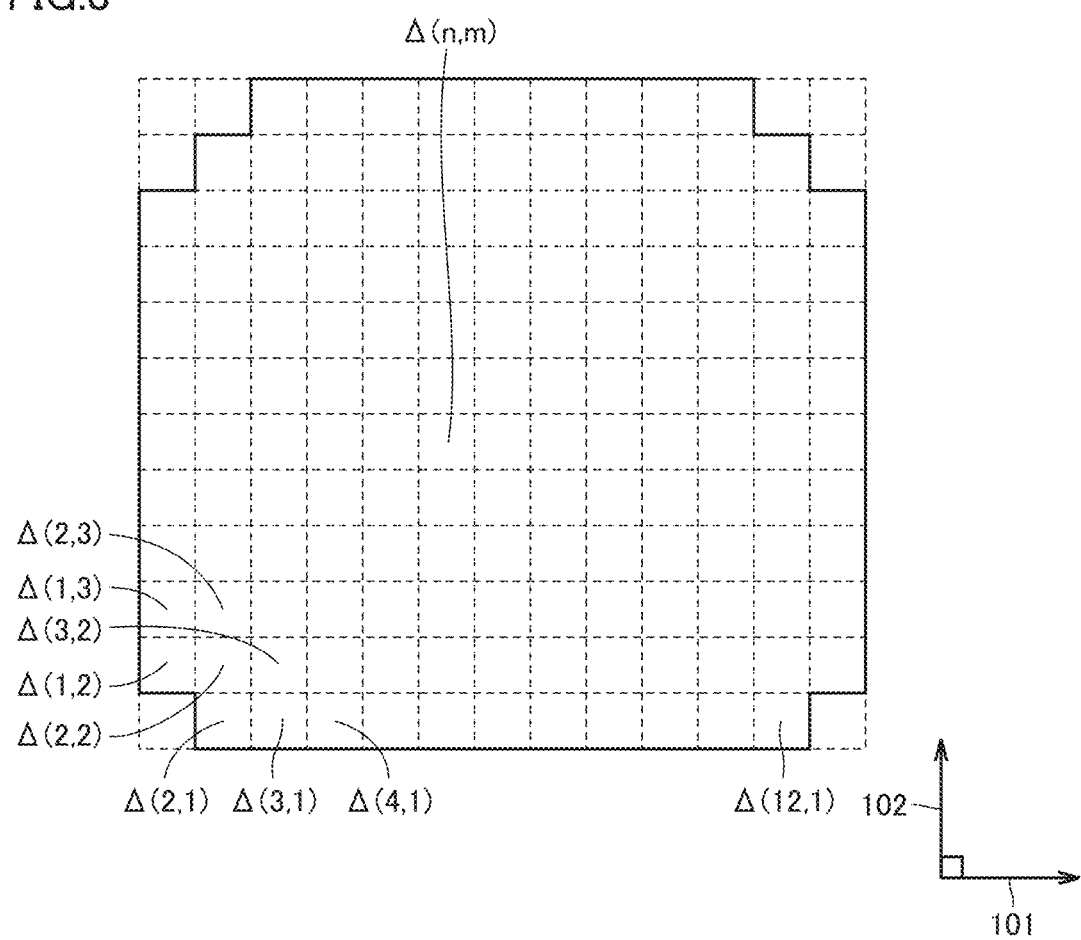
FIG. 8 is a view showing the relation between half-widths of the peak and the measurement positions.

FIG. 8 shows distribution of half-widths within the first main surface (in-plane distribution). As shown in FIG. 8, half-widths Δ(n, m) are determined in 148 square areas within a region surrounded by a solid line. Here, n is an integer from 1 to 13, and m is an integer from 1 to 12. However, half-widths Δ(n, m) at positions where (n, m) is (1, 1), (13, 1), (1, 11), (1, 12), (2, 12), (12, 12), (13, 11), and (13, 12) are excluded.

Then, the average value and the standard deviation of the half-widths are calculated. The average value and the standard deviation of the half-widths of the peak corresponding to the folded mode of the longitudinal optical branch of the Raman spectrum of the silicon carbide substrate in the plurality of (148) square areas are the average value and the standard deviation of the half-widths within first main surface 1. The half-widths of the peak corresponding to the folded mode of the longitudinal optical branch of the Raman spectrum of the silicon carbide substrate within first main surface 1 may have an average value of less than 2.5 cm$^{-1}$, and a standard deviation of less than or equal to 0.06 cm$^{-1}$. The half-widths of the peak corresponding to the folded mode of the longitudinal optical branch of the Raman spectrum of the silicon carbide substrate within first main surface 1 may have an average value of less than 2.45 cm$^{-1}$. The half-widths of the peak corresponding to the folded mode of the longitudinal optical branch of the Raman spectrum of the silicon carbide substrate within first main surface 1 may have a standard deviation of less than or equal to 0.05 cm$^{-1}$.

Next, a method for manufacturing silicon carbide substrate 10 according to the present embodiment will be described.

Figure 9:
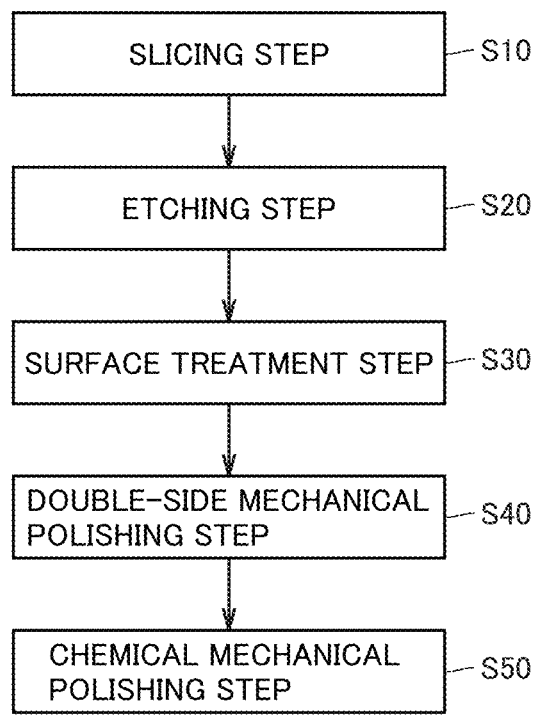
FIG. 9 is a flowchart showing a method for manufacturing the silicon carbide substrate according to the present embodiment.

As shown in FIG. 9, first, a slicing step (S10) is performed. Specifically, an ingot made of a silicon carbide single crystal having a polytype of 4H is formed by sublimation, for example. The ingot is shaped and then sliced by a wire saw device. Thereby, silicon carbide substrate 10 is cut out from the ingot. Diamond abrasive grains are fixed to the surface of a saw wire. The diamond abrasive grains have a diameter of more than or equal to 15 μm and less than or equal to 25 μm, for example. The saw wire has a diameter of 120 μm, for example. The saw wire has a linear speed of more than or equal to 800 m/min and less than or equal to 1500 m/min, for example. The saw wire has a tension of 18 N, for example.

Silicon carbide substrate 10 is made of hexagonal silicon carbide having a polytype of 4H. Silicon carbide substrate 10 has first main surface 1, and second main surface 2 opposite to first main surface 1. First main surface 1 is a plane angled off by less than or equal to 4° in a <11-20> direction relative to a {0001} plane, for example. Specifically, first main surface 1 is a plane angled off by an angle of less than or equal to about 4° relative to a (0001) plane, for example. Second main surface 2 is a plane angled off by an angle of less than or equal to about 4° in the <11-20> direction relative to a (000-1) plane, for example.

Figure 10:
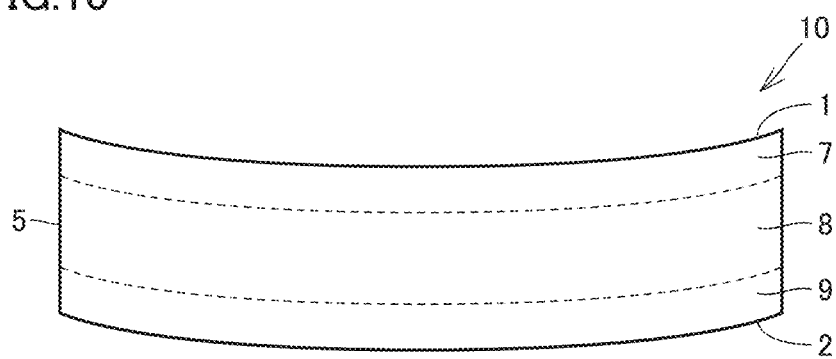
FIG. 10 is a schematic cross sectional view showing a first step of the method for manufacturing the silicon carbide substrate according to the present embodiment.
Figure 11:
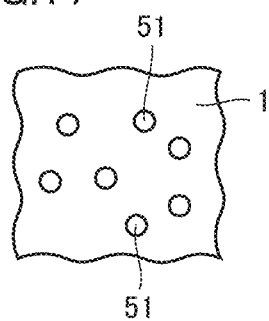
FIG. 11 is a schematic plan view showing the first step of the method for manufacturing the silicon carbide substrate according to the present embodiment.

As shown in FIG. 10, silicon carbide substrate 10 has a first region 7, an intermediate region 8, and a second region 9. First region 7 is a region including first main surface 1. Second region 9 is a region including second main surface 2. Intermediate region 8 is a region between first region 7 and second region 9. In the slicing step described above, processing damage is caused to each of first region 7 and second region 9. This causes each of first region 7 and second region 9 to be distorted more than intermediate region 8. Due to distortion or the like caused by the processing damage, silicon carbide substrate 10 after the slicing step may be curved. First main surface 1 is curved to be a concave surface, for example. Second main surface 2 is curved to be a convex surface, for example. As shown in FIG. 11, in first main surface 1 of silicon carbide substrate 10, distortion regions 51 may be dispersed, each having a substantially circular shape when viewed from the direction perpendicular to first main surface 1. Distortion region 51 is a region where the processing damage remains. Distortion region 51 differs in stress from a region around distortion region 51.

Figure 12:
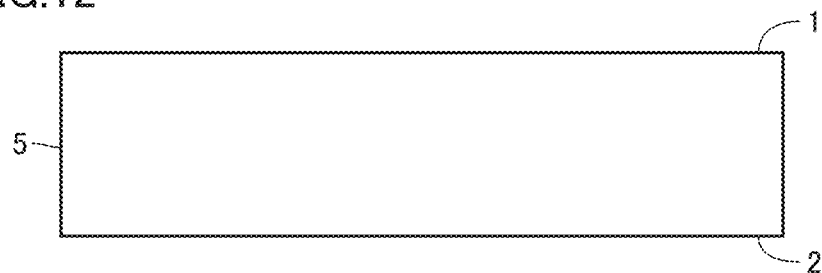
FIG. 12 is a schematic cross sectional view showing a second step of the method for manufacturing the silicon carbide substrate according to the present embodiment.

Subsequently, an etching step (S20) is performed. Specifically, silicon carbide substrate 10 is etched by immersing entire silicon carbide substrate 10 in an etching solution prepared by mixing potassium hydroxide (KOH), potassium permanganate (KMnO$_4$), and pure water. The etching solution has a volume ratio of KOH: KMnO$_4$:pure water=5 to 15:1 to 3:20 to 30. The etching solution is at a temperature of more than or equal to 70° C. and less than or equal to 95° C., for example. Thereby, the surfaces of silicon carbide substrate 10 are etched by more than or equal to about 1 μm and less than or equal to about 5 μm. The etching reduces stress distribution in the thickness direction of silicon carbide substrate 10. As a result, warpage of silicon carbide substrate 10 is reduced (see FIG. 12). First main surface 1 is now substantially parallel to second main surface 2.

Subsequently, a surface treatment step (S30) is performed. Specifically, silicon carbide substrates 10 is immersed in ozone water for about 20 minutes. The ozone water is put in a container. The ozone water is supplied to the container at a constant flow rate, and the ozone water is continuously poured. Stated from another perspective, while silicon carbide substrate 10 is immersed in the ozone water, the ozone water overflows from the container. The ozone water is at a temperature of 25° C. (room temperature), for example. The ozone water has a pH of 7.0 (neutral), for example. The ozone water has a concentration of 80 mg/L, for example. The ozone water has a flow rate of 1.5 L per minute, for example. Thereby, each of first main surface 1 and second main surface 2 are oxidized. As a result, each of first main surface 1 and second main surface 2 has a higher hydrophilicity.

Subsequently, a double-side mechanical polishing step (S40) is performed. Specifically, silicon carbide substrate 10 is disposed between a first surface plate (not shown) and a second surface plate (not shown) such that first main surface 1 faces the first surface plate and second main surface 2 faces the second surface plate. Then, slurry is introduced between first main surface 1 and the first surface plate, and between second main surface 2 and the second surface plate. The slurry includes diamond abrasive grains and water, for example. The diamond abrasive grains have a diameter of more than or equal to 1 μm and less than or equal to 3 μm, for example. With a load applied to first main surface 1 by the first surface plate and a load applied to second main surface 2 by the second surface plate, mechanical polishing is performed on both sides of silicon carbide substrate 10.

Subsequently, a chemical mechanical polishing step (S50) is performed. Specifically, first, first chemical mechanical polishing (CMP) is performed on first main surface 1 of silicon carbide substrate 10. Silicon carbide substrate 10 is held by a polishing head such that first main surface 1 faces the surface plate. Aluminum oxide is used as abrasive grains. The abrasive grains have an average grain size of 180 nm. A nitrate-based oxidizing agent is used as an oxidizing agent. A load (surface pressure) on silicon carbide substrate 10 is more than or equal to 250 gf/cm$^2$ and less than or equal to 500 gf/cm$^2$, for example. The surface plate has a rotational speed of more than or equal to 60 rpm and less than or equal to 90 rpm, for example. The polishing head has a rotational speed of more than or equal to 80 rpm and less than or equal to 120 rpm.

Subsequently, second CMP is performed on first main surface 1 of silicon carbide substrate 10. Specifically, colloidal silica is used as abrasive grains. A hydrogen peroxide solution to which vanadate has been added is used as an oxidizing agent. A load (surface pressure) on silicon carbide substrate 10 is 300 gf/cm$^2$, for example. Thereby, distortion of first main surface 1 of silicon carbide substrate 10 is reduced. Thus, silicon carbide substrate 10 according to the present embodiment is manufactured (see FIG. 1).

Next, a method for forming a silicon carbide epitaxial layer on silicon carbide substrate 10 according to the present embodiment will be described.

Figure 13:
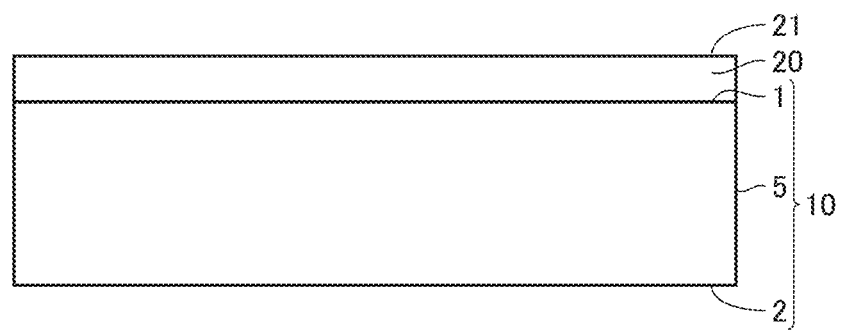
FIG. 13 is a schematic cross sectional view showing a step of forming a silicon carbide epitaxial layer on the silicon carbide substrate according to the present embodiment.

Silicon carbide substrate 10 is disposed in a reaction chamber of a hot-wall type lateral chemical vapor deposition (CVD) apparatus, for example. Then, silicon carbide substrate 10 is raised in temperature to about 1630° C., for example. Then, a mixed gas including silane (SiH$_4$), propane (C$_3$H$_8$), ammonia (NH$_3$), and hydrogen (H$_2$), for example, is introduced into the reaction chamber. Thereby, silicon carbide epitaxial layer 20 is formed on first main surface 1 of silicon carbide substrate 10 (see FIG. 13). As shown in FIG. 13, silicon carbide epitaxial layer 20 is in contact with first main surface 1. The silicon carbide epitaxial layer has a surface 21 on a side opposite to its side in contact with first main surface 1. Silicon carbide epitaxial layer 20 has a thickness of more than or equal to 5 μm and less than or equal to 100 μm, for example.

Next, functions and effects of silicon carbide substrate 10 according to the present embodiment will be described.

The chemical property of a silicon plane of silicon carbide substrate 10 is different from the chemical property of a carbon plane thereof. Specifically, the silicon plane has hydrophobicity, whereas the carbon plane has hydrophilicity. Since the silicon plane has a low hydrophilicity, it leads to a weak adhesive strength (bonding strength) between the surface (silicon plane side) of the silicon carbide substrate and the slurry including water. In contrast, since the carbon plane has a high hydrophilicity, it leads to a strong adhesive strength (bonding strength) between the surface (carbon plane side) of the silicon carbide substrate and the slurry including water. Accordingly, when double-side mechanical polishing is performed on silicon carbide substrate 10, the friction load acting on the silicon plane is significantly different from the friction load acting on the carbon plane. As a result, while the double-side mechanical polishing is performed on silicon carbide substrate 10, vibration may occur in silicon carbide substrate 10. Thereby, the diamond abrasive grains are locally pressed strongly against first main surface 1 of silicon carbide substrate 10. As a result, regions where severe processing damage is caused are dispersed in first main surface 1. As shown in FIG. 11, distortion regions 51 are dispersed in first main surface 1, each having a substantially circular shape when viewed from the direction perpendicular to first main surface 1. Distortion region 51 is a region where the processing damage remains.

Figure 14:
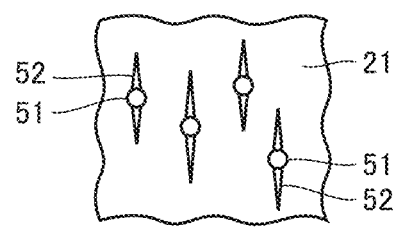
FIG. 14 is a schematic plan view showing a step of forming a silicon carbide epitaxial layer on a silicon carbide substrate according to a comparative example.

When distortion regions 51 remain in first main surface 1 of silicon carbide substrate 10, silicon carbide epitaxial layer 20 formed on first main surface 1 of silicon carbide substrate 10 may have a deteriorated quality. Specifically, when silicon carbide substrate 10 is raised in temperature, linear streaks may be formed, originating from distortion regions 51. When forming silicon carbide epitaxial layer 20 on silicon carbide substrate 10, the linear streaks formed in first main surface 1 of silicon carbide substrate 10 are transferred to silicon carbide epitaxial layer 20 formed on first main surface 1. As a result, linear streaks 52 are formed in surface 21 of silicon carbide epitaxial layer 20 (see FIG. 14). Linear streaks 52 are protrusions. Linear streaks 52 extend along a <1-100> direction, for example. When viewed from a direction perpendicular to surface 21, the width of linear streak 52 may become smaller with distance from distortion region 51.

On silicon carbide substrate 10 according to the present embodiment, hydrophilization treatment is performed using the ozone water in the surface treatment step (S30). Thereby, both the silicon plane and the carbon plane are oxidized. As a result, both first main surface 1 and second main surface 2 exhibit hydrophilicity. Accordingly, when the double-side mechanical polishing is performed, load imbalance in first main surface 1 and second main surface 2 is reduced. Therefore, vibration of silicon carbide substrate 10 during the double-side mechanical polishing step can be suppressed. As a result, formation of local distortion regions 51 is suppressed in each of the square areas in first main surface 1.

When distortion regions 51 are dispersed in a square area, stress distribution in the square area increases, and the half-width of the peak corresponding to the folded mode of the longitudinal optical branch of the Raman spectrum increases. Conversely, when there is no distortion region 51 in a square area, stress distribution in the square area decreases, and the half-width of the peak decreases. That is, when formation of local distortion regions 51 is suppressed in each of the square areas in first main surface 1, the half-widths of the peak corresponding to the folded mode of the longitudinal optical branch of the Raman spectrum have a small average value, and have a small standard deviation. According to silicon carbide substrate 10 in the present embodiment, the half-widths of the peak corresponding to the folded mode of the longitudinal optical branch of the Raman spectrum of the silicon carbide substrate within a plane of the first main surface have an average value of less than 2.5 cm$^{-1}$, and a standard deviation of less than or equal to 0.06 cm$^{-1}$. This can suppress formation of linear streaks 52 in surface 21 of silicon carbide epitaxial layer 20 formed on silicon carbide substrate 10.

EXAMPLE (Preparation of Samples)

Silicon carbide substrates 10 according to samples 1 to 4 were prepared. Silicon carbide substrates 10 according to samples 1 and 2 represented comparative examples. Silicon carbide substrates 10 according to samples 3 and 4 represented examples. In the method for manufacturing silicon carbide substrates 10 according to samples 1 and 2, the manufacturing steps in FIG. 9 other than the surface treatment step (S30) were performed. That is, in the method for manufacturing silicon carbide substrates 10 according to samples 1 and 2, the surface treatment step (S30) in FIG. 9 was not performed. In the method for manufacturing silicon carbide substrates 10 according to samples 3 and 4, all steps in FIG. 9 including the surface treatment step (S30) were performed. Ozone concentrations in the surface treatment step (S30) for the silicon carbide substrates of samples 3 and 4 were set to 40 mg/L and 80 mg/L, respectively.

(Evaluation Method 1)

Raman spectroscopy was used to measure a Raman spectrum of silicon carbide substrate 10 in each of the 148 square areas (see FIG. 4) in first main surface 1 of silicon carbide substrates 10 according to samples 1 to 4. Using the Raman spectrum, in-plane distribution of Δv(Ne) was determined. Likewise, in-plane distribution of half-widths (FWHM) of a peak was determined. Here, Δv(Ne) is a value obtained by subtracting a wave number of a peak of a Raman spectrum of neon from a wave number of a peak corresponding to a folded mode of a longitudinal optical branch of silicon carbide having a polytype of 4H. Using the wave number indicating the peak of the Raman spectrum of neon as a reference, the wave number of the peak corresponding to the folded mode of the longitudinal optical branch of silicon carbide was determined. The direction of measurement of the peak corresponding to the folded mode of the longitudinal optical branch and the half-width of the peak was as described above. A value $(Δv(Ne)_0)$ obtained by subtracting the wave number indicating the peak of the Raman spectrum of neon from the wave number indicating the peak corresponding to the folded mode of the longitudinal optical branch of the Raman spectrum of silicon carbide having a polytype of 4H and having zero stress was $-44.25$ cm$^{-1}$, for example.

(Evaluation Result 1)

TABLE 1

| Sample No. | Sample 1 | Sample 2 | Sample 3 | Sample 4 |
|---|---|---|---|---|
| Substrate Treatment Step (Ozone Concentration) | not performed | not performed | performed (40 mg/L) | performed (80 mg/L) |
| Average Value of FWHM (unit: cm$^{-1}$) | 2.49 | 2.53 | 2.28 | 2.45 |
| Standard Deviation of FWHM (unit: cm$^{-1}$) | 0.085 | 0.076 | 0.058 | 0.046 |
| Haze of Surface of Silicon Carbide Epitaxial Layer | 44 | 42 | 33 | 28 |
| Linear Streaks in Surface of Silicon Carbide Epitaxial Layer | B | B | A | A |

As shown in Table 1, in silicon carbide substrates 10 according to samples 1 to 4, the average value of the half-widths (FWHM) of the peak corresponding to the folded mode of the longitudinal optical branch of the Raman spectrum of the silicon carbide substrate in the plurality of (148) square areas was 2.49 cm$^{-1}$, 2.53 cm$^{-1}$, 2.28 cm$^{-1}$, and 2.45 cm$^{-1}$, respectively. The standard deviation of the half-widths (FWHM) of the peak was 0.085 cm$^{-1}$, 0.076 cm$^{-1}$, 0.058 cm$^{-1}$, and 0.046 cm$^{-1}$, respectively.

Then, silicon carbide epitaxial layer 20 was formed by epitaxial growth on first main surface 1 of silicon carbide substrates 10 according to samples 1 to 4, to manufacture silicon carbide epitaxial substrates. The manufacturing conditions for the silicon carbide epitaxial substrates were as described above.

(Evaluation Method 2)

Next, haze of surface 21 of silicon carbide epitaxial layer 20 formed on silicon carbide substrates 10 according to samples 1 to 4 was measured, and linear streaks were observed. The haze is an indicator indicating the degree of surface roughness. The value of the haze decreases as the number of linear streaks in surface 21 decreases. Completely flat surface 21 has a haze of 0. The unit of the haze is dimensionless. The haze was measured using WASAVI Series "SICA 6X" provided by Lasertec Corporation. Specifically, light with a wavelength of 546 nm was emitted from a light source such as a mercury xenon lamp onto surface 21 of the silicon carbide epitaxial substrate, and reflected light of the light was observed by a light receiving element such as a charge-coupled device (CCD), for example. The difference between brightness of one pixel in an observed image and brightness of pixels around the one pixel was quantified. The haze quantifies the difference in brightness among a plurality of pixels included in the observed image, by the following method.

Specifically, a maximum haze value in rectangular areas obtained by dividing one field of view for observation measuring 1.8 mm±0.2 mm per side into 64 areas was derived. The one field of view for observation included a 1024×1024-pixel imaging region. The maximum haze value was obtained by calculating edge intensity in the horizontal direction and the vertical direction of the field of view for observation with a Sobel filter, and deriving an absolute value thereof. Through the above procedure, the maximum haze value of each field of view for observation was observed in entire surface 21 of silicon carbide epitaxial layer 20. The average value of the maximum haze values of the fields of view for observation was determined as a haze value in surface 21 of silicon carbide epitaxial layer 20.

Further, the number of linear streaks 52 (see FIG. 14) in surface 21 of silicon carbide epitaxial layer 20 formed on silicon carbide substrates 10 according to samples 1 to 4 was measured. A measurement area was a 250 μm×250 μm square area. A linear protrusion having a height of more than or equal to 0.5 μm was identified as a streak.

(Evaluation Result 2)

As shown in Table 1, the haze of surface 21 of silicon carbide epitaxial layer 20 formed on silicon carbide substrates 10 according to samples 1 to 4 was 44, 42, 33, and 28, respectively. Further, the evaluation result for linear streaks 52 formed in surface 21 of silicon carbide epitaxial layer 20 formed on silicon carbide substrates 10 according to samples 1 to 4 was B, B, A, and A, respectively. It should be noted that evaluation result A means that the number of linear streaks 52 in surface 21 is less than or equal to four. In addition, evaluation result B means that the number of linear streaks 52 in surface 21 is more than or equal to five.

From the above results, it has been confirmed that the quality of silicon carbide epitaxial layer 20 formed on the silicon carbide substrates according to samples 3 and 4 can be improved, when compared with silicon carbide epitaxial layer 20 formed on the silicon carbide substrates according to samples 1 and 2. Specifically, it has been confirmed that the haze can be reduced in surface 21 of silicon carbide epitaxial layer 20 formed on the silicon carbide substrates according to samples 3 and 4, when compared with surface 21 of silicon carbide epitaxial layer 20 formed on the silicon carbide substrates according to samples 1 and 2. It has also been confirmed that the number of linear streaks 52 can be reduced in surface 21 of silicon carbide epitaxial layer 20 formed on the silicon carbide substrates according to samples 3 and 4, when compared with surface 21 of silicon carbide epitaxial layer 20 formed on the silicon carbide substrates according to samples 1 and 2. That is, it has been confirmed that the quality of the silicon carbide epitaxial layer formed on the silicon carbide substrate can be improved, when the half-widths of the peak corresponding to the folded mode of the longitudinal optical branch of the Raman spectrum of the silicon carbide substrate within a plane of the first main surface have an average value of less than 2.5 cm$^{-1}$, and a standard deviation of less than or equal to 0.06 cm$^{-1}$.

It should be understood that the embodiment and example disclosed herein are illustrative and non-restrictive in every respect. The scope of the present invention is defined by the scope of the claims, rather than the description above, and is intended to include any modifications within the scope and meaning equivalent to the scope of the claims.

REFERENCE SIGNS LIST

1: first main surface; 2: second main surface; 3: first flat; 4: arc-shaped portion; 5: outer circumferential surface; 6: center; 7: first region; 8: intermediate region; 9: second region; 10: silicon carbide substrate; 11: plane; 20: silicon carbide epitaxial layer; 21: surface; 30: Raman spectroscopic apparatus; 31: objective lens; 32: light source; 33: spectroscope; 34: stage; 35: beam splitter; 36: incident light; 37: measurement area; 38: detector; 41: first peak (peak); 42: second peak; 43: third peak; 44: fourth peak; 50: Raman profile; 51: distortion region; 52: streak; 61, 62, 63: arrow; 101: first direction; 102: second direction; 111: maximum diameter; 112: thickness; θ: off angle.

The invention claimed is:

1. A silicon carbide substrate comprising:
a first main surface and a second main surface opposite to the first main surface, the silicon carbide substrate being made of silicon carbide having a polytype of 4H,
the first main surface having a maximum diameter of more than or equal to 140 mm,
the first main surface being a {0001} plane or a plane inclined at an off angle of more than 0° and less than or equal to 8° relative to the {0001} plane,
half-widths of a peak corresponding to a folded mode of a longitudinal optical branch of a Raman spectrum of the silicon carbide substrate within a plane of the first main surface having an average value of less than 2.5 $cm^{-1}$, and a standard deviation of less than or equal to 0.06 $cm^{-1}$,
wherein the first main surface and the second main surface each exhibit hydrophilicity.

2. The silicon carbide substrate according to claim 1, wherein the silicon carbide substrate has a thickness of more than or equal to 300 μm and less than or equal to 600 μm.

* * * * *